(12) United States Patent
Mariner et al.

(10) Patent No.: US 8,512,806 B2
(45) Date of Patent: Aug. 20, 2013

(54) LARGE VOLUME EVAPORATION SOURCE

(75) Inventors: John Mariner, Avon Lake, OH (US); Douglas A. Longworth, Brecksville, OH (US); Donald William Pultz, Jr., Parma, OH (US); Feng Liao, Parma Heights, OH (US); David M. Rusinko, Parma Heights, OH (US); Zhong-Hao Lu, Chagrin Falls, OH (US); Timothy J. Hejl, Independence, OH (US)

(73) Assignee: Momentive Performance Materials Inc., Waterford, NY (US)

( * ) Notice: Subject to any disclaimer, the term of this patent is extended or adjusted under 35 U.S.C. 154(b) by 1213 days.

(21) Appl. No.: 12/228,392

(22) Filed: Aug. 12, 2008

(65) Prior Publication Data

US 2010/0040780 A1 Feb. 18, 2010

(51) Int. Cl.
*C23C 16/00* (2006.01)

(52) U.S. Cl.
USPC ....................................... 427/248.1; 118/726

(58) Field of Classification Search
USPC ....................................... 118/726; 427/248.1
See application file for complete search history.

(56) References Cited

U.S. PATENT DOCUMENTS

| | | | |
|---|---|---|---|
| 4,534,099 A | 8/1985 | Howe | |
| 4,812,326 A * | 3/1989 | Tsukazaki et al. | 427/562 |
| 5,031,229 A * | 7/1991 | Chow | 392/389 |
| 5,395,180 A | 3/1995 | Mariner | |
| 5,493,630 A | 2/1996 | Mariner et al. | |
| 5,495,550 A | 2/1996 | Mariner et al. | |
| 6,404,982 B1 | 6/2002 | Mariner et al. | |
| 2005/0064247 A1 | 3/2005 | Sane et al. | |
| 2006/0127067 A1 | 6/2006 | Wintenberger et al. | |
| 2006/0237441 A1 | 10/2006 | Fujimura et al. | |
| 2007/0215596 A1 | 9/2007 | Wintenberger et al. | |
| 2007/0224451 A1 | 9/2007 | Chandran et al. | |
| 2007/0281081 A1 | 12/2007 | Nakamura et al. | |
| 2008/0066676 A1 | 3/2008 | Mariner et al. | |

FOREIGN PATENT DOCUMENTS

| | | |
|---|---|---|
| CN | 1946868 A | 4/2007 |
| DE | 1 276 421 B | 8/1968 |
| DE | 1276421 | 8/1968 |
| JP | 61-132589 A | 6/1986 |
| JP | 2003-253430 A | 9/2003 |
| WO | WO96/35091 | 11/1996 |
| WO | WO98/08780 | 3/1998 |
| WO | 2006/076287 A1 | 7/2006 |

OTHER PUBLICATIONS

Fernando Rinaldi, *Basics of Molecular Beam Epitaxy (MBE)*. Annual Report 2002, Optoelectronics Department, University of Ulm, pp. 1-8.

English Translation of Chinese Office action for CN 2009-80140280.3 dated Sep. 21, 2012.

* cited by examiner

*Primary Examiner* — Robert A Hopkins
(74) *Attorney, Agent, or Firm* — Joseph E. Waters (57) ABSTRACT

A containment vessel for evaporating materials for use in applying film coatings to a substrate includes a body fabricated from a refractory material. In one embodiment the body includes end portions capable of being connected to other bodies in an end to end fashion. In another embodiment, the body includes an integral patterned conductor incorporated into the outer surface portion of the body to facilitate association with an electrical power source for heating.

12 Claims, 9 Drawing Sheets

LARGE VOLUME EVAPORATION SOURCE

FIELD OF THE INVENTION

The present invention relates to an evaporation source used, for example, for the evaporation of materials in the production of thin films.

BACKGROUND OF THE ART

Containment vessels are used for the evaporation of materials, for example, to deposit thin films on substrates. Typically, such containment vessels are crucibles capable of withstanding high temperatures for the vaporization of the contents of the crucible. In the photovoltaic industry, for example, materials such as copper, aluminum, indium, gallium or selenium are vaporized and deposited as a thin film coating on a substrate.

The crucibles are heated by conventional means such as electrical resistance heating coils, induction heating and the like to provide an evaporation system. The crucibles can be arranged in an array below the substrate, which is coated by the vaporized material us it is passed over the top of the evaporation system. The system is operated under a sufficiently low vacuum to enable evaporation of the metals. Many of the techniques are similar to those used for molecular beam epitaxi ("MBE") which has a sufficiently low vacuum to provide a molecular beam flow from the crucible to the substrate.

Ideally, the crucibles will have several desirable features. They should be resistant to the corrosive action of the molten materials which they hold, and to the metal vapors. They should be stable up to about 1,800° C., and in vacuum. They should be easy to charge with a sufficient volume of film-forming materials, easy to heat, and they should have a top opening geometry engineered to control the pattern of vapor flux flowing from the crucible(s) to the substrate. This is true for MBE and is well documented in the literature, and, by logical extension, is needed in the photovoltaic industry as well.

Typically the crucibles are made from such materials as hot pressed boron nitride (hpBN), pyrolytic boron nitride (pBN), and graphite (particularly, graphite coated with pBN).

Crucibles can take various forms, but are generally cylindrical or conical, on the order of 10 mm in diameter and 20 mm in length up to about 100 mm in diameter and 400 mm in. length. Larger size crucibles and heaters are advantageous for photovoltaic needs, with standard size production panels typically at 1,200 mm×600 mm.

Historically, MBE crucibles have been open on the top, with substantially straight cylindrical sidewalls, or very open in a conical form. In part, this is to help control the "beam" flow. The shape of the top of the crucible impacts the deposition profile, and impacts the stability of the source material. A conical exit cone seems to be preferred in the MBE industry.

MBE cells are often used at an angle of about 45°, so an open, conical shape may not hold sufficient volume of material. When tipped at an angle, an open cone will pour out its contents. A one-piece, integral crucible, with a large body and a narrow orifice is known in the art. This design is available under the designation SUMO® from Veeco Instruments Inc.

For many metal sources, the material of choice for the crucible is a pyrolytic boron nitride (PBN). PBN is a material produced from chemical vapor deposition (CVD) on a graphite mandrel. To make a narrow orifice crucible part, the narrow orifice is machined into a graphite mandrel, the mandrel is then CVD coated with pBN, then the mandrel is oxidized out of the body of the crucible.

U.S. Pat. No. 4,812,326 discloses an evaporation source having a two-piece design. The evaporation material is vaporized and jetted through a nozzle having a flared opening to control the size of the atom clusters of the vapor jet.

WO96/35091 and WO98/08780 disclose unibody monolithic, one-piece negative draft crucibles for use in MBE effusion cells.

There yet remains need for improvements in crucible construction to accommodate the MBE process and other thermal evaporation processes as used in photovoltaic production.

SUMMARY OF THE INVENTION

A containment vessel for evaporating materials for use in applying a thin film coating to a substrate is provided herein. In one embodiment the containment vessel includes at least one single piece monolithic body fabricated from a refractory ceramic material, the body including a reservoir for containing material to be evaporated, and having two opposite ends with means associated at said ends to permit mechanical joining of at least two of said bodies in an end to end fashion such that the reservoirs of each of said bodies are joined to provide a continuous interior space; and means to control emission of vapor from the containment vessel.

In another embodiment the containment vessel includes at least one body fabricated from a refractory ceramic material, the body having a reservoir to contain material to be evaporated. The body further includes heating means incorporated into an outer exterior surface of the body. The containment vessel further includes means for controlling the emission of vapor therefrom.

In another embodiment the containment vessel includes two pieces which engage each other to form an hermetic seal between them without the necessity of overcoating.

The containment vessel advantageously provides flexibility and adaptability for the arrangement of a system for thin film coating of substrates.

BRIEF DESCRIPTION OF THE DRAWINGS

Various embodiments are described below with reference to the drawings wherein.

DETAILED DESCRIPTION OF THE PREFERRED EMBODIMENTS

As used herein, approximating language may be applied to modify any quantitative representation that may vary without resulting in a change in the basic function to which it is related. Accordingly, a value modified by a term or terms, such as "about" and "substantially," may not be limited to the precise value specified in some cases.

As used herein, the term "crucible" may be used interchangeably with "vessel," or a "container". The term "multi-piece" may be used interchangeably with "multi-part" or "multiple part" to refer to the multiple pieces that make up the unibody (or one piece, a single body) crucible of the invention.

Figure 1:
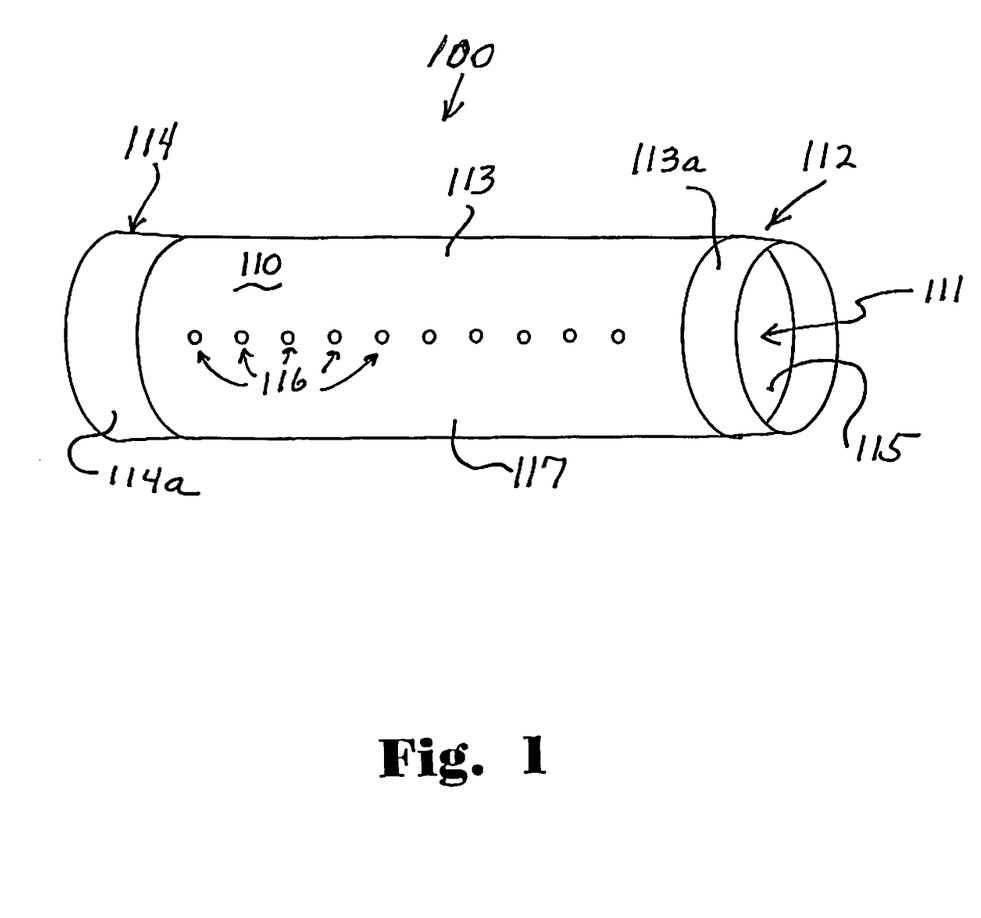
FIG. 1 illustrates a tubular first embodiment of the crucible of the invention.

Referring now to FIG. 1, in one embodiment the containment vessel 100 of the invention includes a cylindrical body 110 having a central axial bore 111 defined by interior surface 115. The bore 111 provides a reservoir for containing material to be evaporated. A plurality of spaced apertures 116 is disposed lengthwise along the body in at least one linear row. The apertures 116 extend from the exterior surface 113 of the middle portion 117 of the body 110 to the bore 111 so as to permit vapors from the bore to exit therethrough.

Figure 1A:
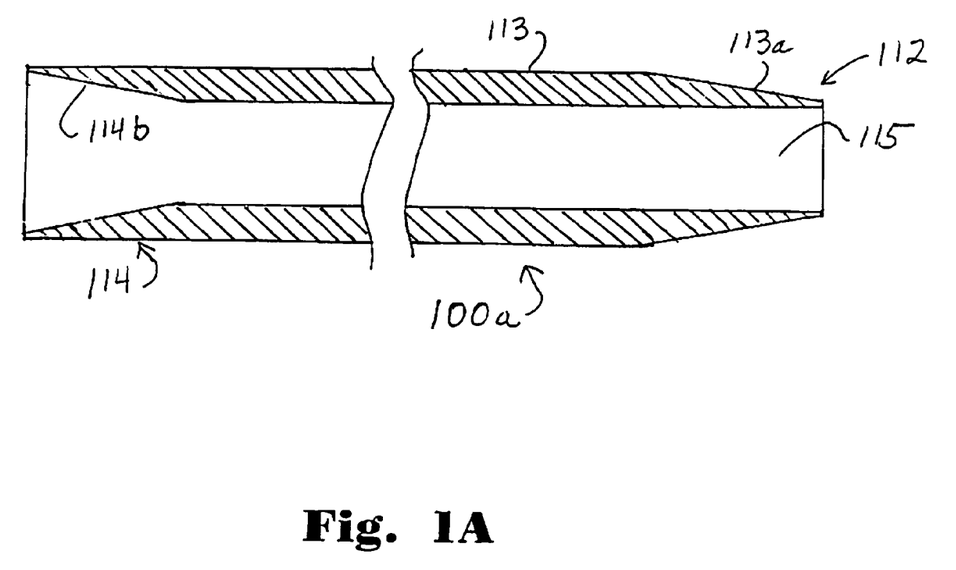
FIG. 1A is a sectional view of another tubular embodiment of the crucible.

The body 110 includes a middle portion 117 and opposite end portions 112 and 114. In one embodiment, the exterior surface 113a of the end portion 112 and the interior surface 112a of the end portion 112 are tapered inward to provide a gradually smaller exterior diameter. End portion 114 is flared outward so as to provide a gradually increasing bore diameter. Optionally, both the annular exterior surface 114a and the interior surface of the end portion 114 can be flared outward. However, in containment vessel embodiment 100a, as shown in FIG. 1A, the exterior surface 114a of the end portion 114 can be of the same diameter as the exterior surface 113 of the central portion 117 of the body 110, with only the inner surface 114b of the body at the end portion 114 flaring outward so as to provide a gradually increasing bore diameter. The inner surface of the end portion 112 can be of the same diameter as that of inner surface 115 with only the outer surface 113 a tapered inward. Preferably, the inclination of tapered outer surface 113 of end portion 112 conforms to the outward inclination of interior flared surface 114b of end portion 114 so as to facilitate a fitted engagement of the end surfaces of respective bodies of containment vessel 100a. The purpose of the configuration of the end portions 112 and 114 is to provide means for assembling two or more vessel bodies 110 together in an end to end fashion so as to provide a containment vessel assembly with a length which can be varied by joining of the appropriate number of bodies, wherein the reservoirs, i.e. bores 111 of the individual bodies are joined to provide a continuous interior space. The flared surface 114b is flared outwardly and the tapered surface 113a is angled inwardly at an angle of from about 3 degrees to about 10 degrees, and is typically such that the friction fitting of the pressed joint provides a stable structure.

Each individual body 110 is preferably of single piece monolithic construction and is fabricated from a nitride, carbide, carbonitride, boride or oxynitride of elements selected from a group consisting of B, Al, Si, Ga, refractory hard metals, transition metals, and rare earth metals, or complexes and/or combinations thereof. In one embodiment, the crucible body is fabricated from a refractory ceramic such as aluminum nitride (AlN), titanium diboride, and preferably pyrolytic boron nitride (pBN) or pBN-coated graphite. Methods for fabricating such vessels are known in the art.

Figure 2:
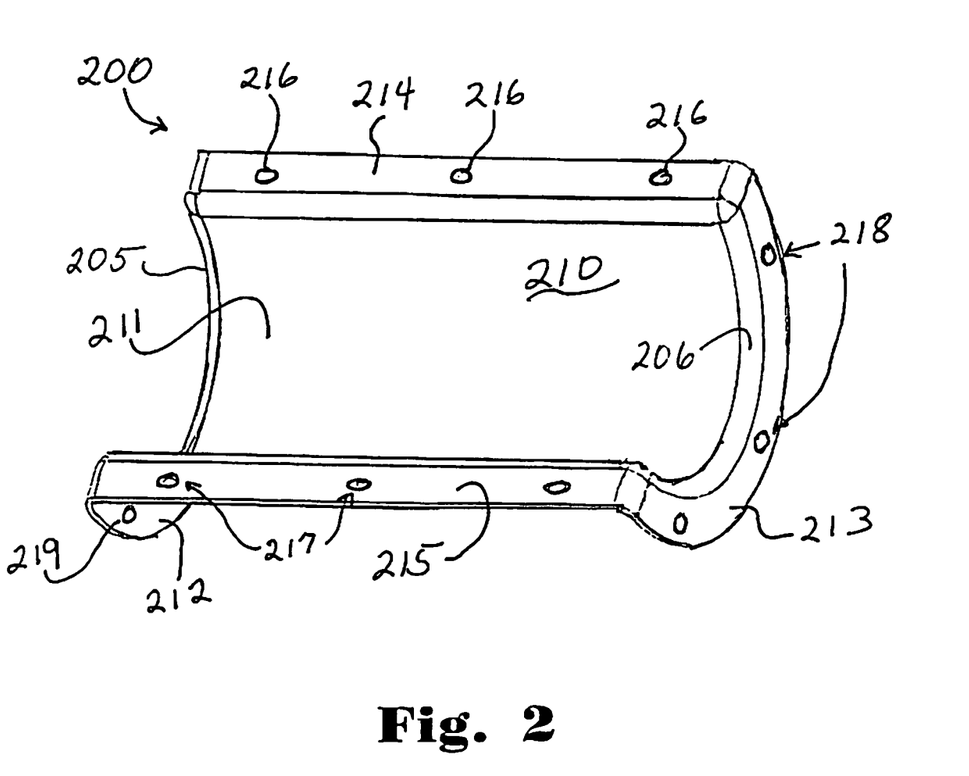
FIG. 2 illustrates a second embodiment of the crucible of the invention.
Figure 3:
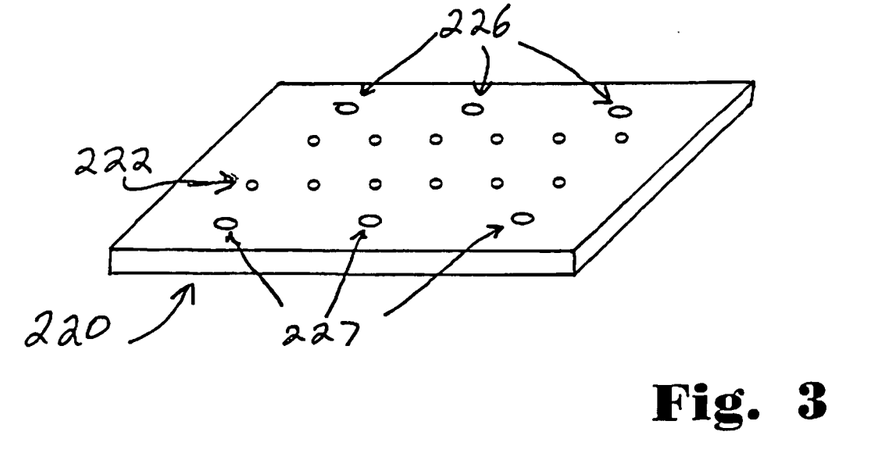
FIG. 3 illustrates a cover plate for the embodiment of FIG. 2.

Referring now to FIGS. 2 and 3, in a second embodiment the containment vessel 200 includes a generally longitudinally extending body 210 having an arcuate inner surface 211 and a generally U-shaped lateral cross section. The arcuate inner surface 211 defines a reservoir for containing the material to be evaporated (e.g., a metal such as Cu, Al, In, Ga, Se, and the like). The body 210 is preferably of single piece monolithic construction and is preferably fabricated from pBN or pBN-coated graphite. The body 210 includes lengthwise extending linear flange portions 214 and 215, and terminal arcuate flange portions 212 and 213. Terminal flange portions 212 and 213 include one or more apertures 219 and 218, respectively. Linear flange portions 214 and 215 include one or more apertures 216 and 217, respectively. Apertures 218 and 219 are adapted to receive fasteners such as screws, bolts (not shown) and the like, and are configured to align with each other so as to facilitate the end-to-end removable assembly of individual bodies 210 to form a containment vessel assembly with a length which can be varied as desired, wherein the reservoirs defined by the inner surfaces 211 of the individual bodies 210 are joined to provide a continuous inner space. Optionally, one end of the body 210 can include a longitudinally extending arcuate flange 205 and the other end can include an arcuate recessed portion 206 configured and dimensioned to mate with said flange 205 for the reasons stated below. A cover plate 220 (FIG. 3) is configured and dimensioned so as to be mounted to the top of body 210. Cover plate includes one or more apertures 226 configured to align with apertures 216 of the linear flange portion 214, and one or more apertures 227 configured to align with apertures 217 of linear flange portion 215 of the body 210, so as to receive fasteners (screws, bolts, etc.) to permit removable mounting of plate 220 to body 210. Plate 220 includes a plurality of apertures 222 to permit emission of vapor therethrough.

Figure 2A:
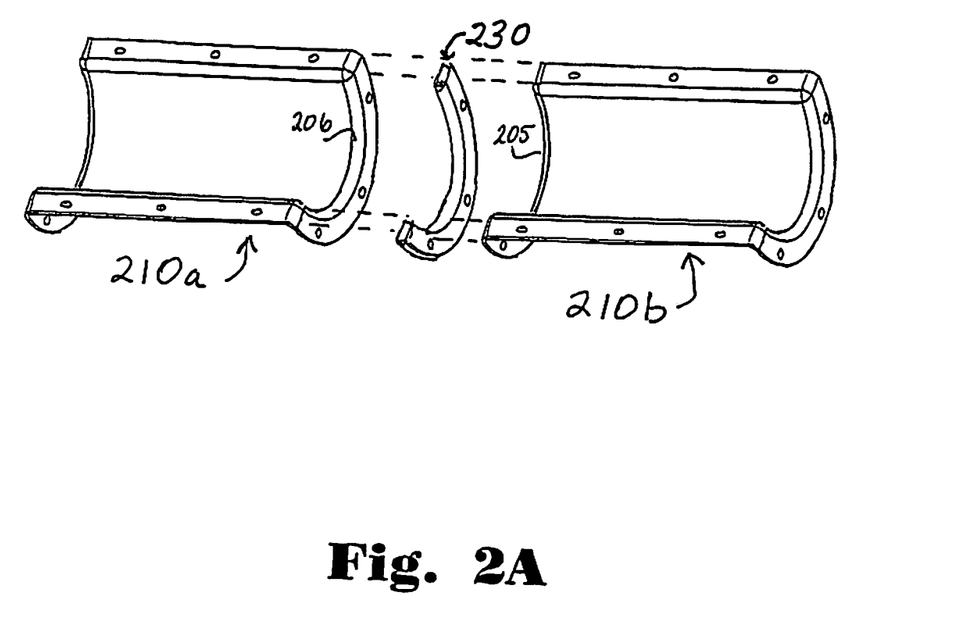
FIG. 2A illustrates the assembly of crucibles of the embodiment of FIG. 2 with an intermediate gasket member.

FIG. 2A illustrates an assembly of bodies 210a and 210b joined end to end with a gasket 230 disposed therebetween. The gasket is preferably fabricated from graphite, such as a Grafoil type gasket, and is crescent shaped to match the terminal arcuate flanges 212 and 213. Preferably, the gasket 230 is protected from contact with the molten metal coating material by the longitudinally extending arcuate flange 205 which overhangs the gasket. The gasket also inhibits "welding" of the connected individual bodies at the terminal flanges 212 and 213 which might otherwise be caused by depositing of evaporated metal at the joint between the bodies.

Figure 4:
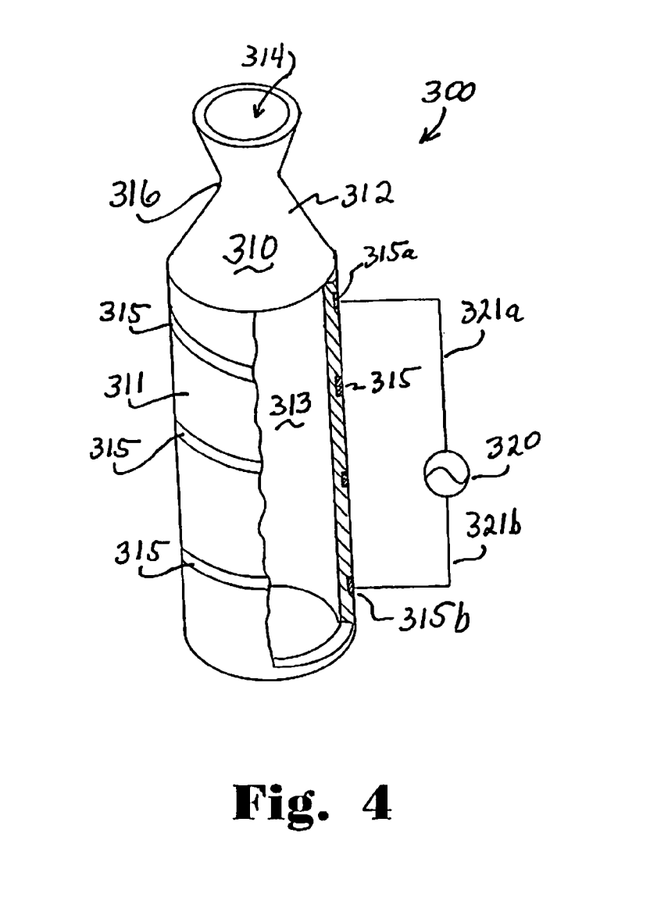
FIG. 4 is a partially cut away perspective view illustrating an embodiment of the invention having a generally cylindrical shape with an hour glass shaped upper portion.

Referring now to FIG. 4, in another embodiment the containment vessel 300 includes a crucible body 310 having an interior reservoir 313 for containing the material to be evaporated. Body 310 has a cylindrical portion 311 and an upper hourglass shaped portion 312, which tapers to a narrow portion 316 and expands thereafter to circular top opening 314. The narrow portion 316 is configured and dimensioned so as to provide a cross section adapted to control the quantity and direction of vapor flow therethrough. The body 310 is preferably made from a non-electrically conductive material such as pBN, but includes an integral patterned refractory electrically conductor 315 of pyrolytic or bulk graphite which wraps around the exterior of the cylindrical portion 311 of the body 310. A method of making the integral heater is described in U.S. Pat. No. 7,259,358, which is herein incorporated by reference.

Preferably, the conductor 315 is overcoated with an additional layer of pBN. In one embodiment, an electrical power source 320 is connected to terminal points 315a and 315b of conductive line 315 by means of wires 321a and 321b, respectively. During operation, electrical power applied to conductive line 315 causes it to heat body 310 to a temperature sufficiently high to cause vaporization of at least part of the contents within the interior reservoir 313 of the containment vessel. Heating can be by resistance heating or induction heating.

Figure 5:
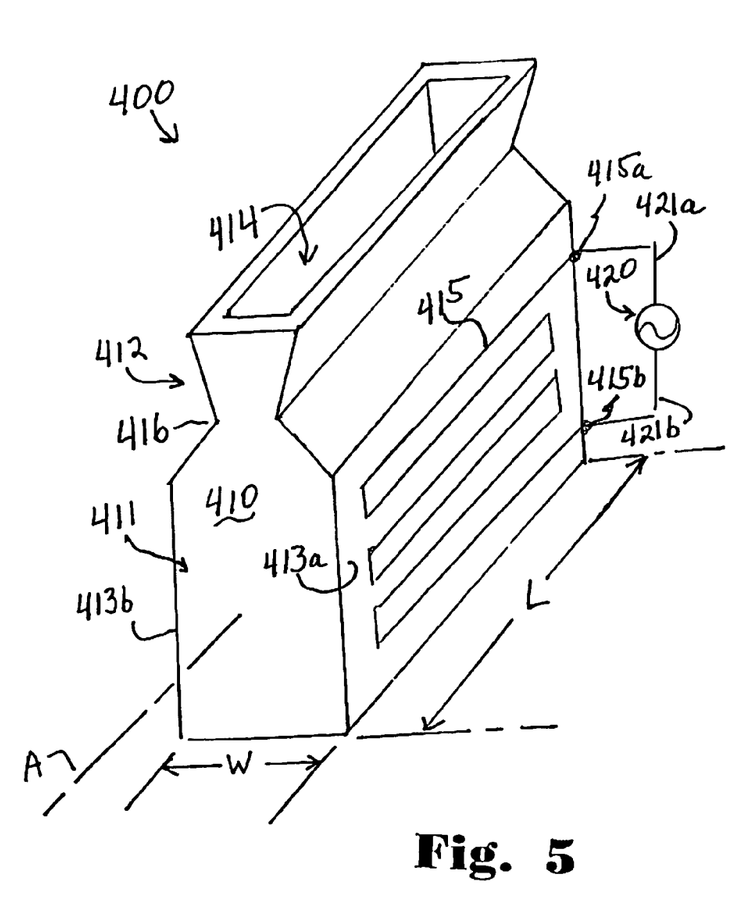
FIG. 5 illustrates an elongated embodiment of the crucible.

Referring now to FIG. 5, in an alternative embodiment 400 the container vessel includes a body 410 having a lower portion 411 with an interior reservoir adapted to contain a material to be vaporized. Unlike cylindrical body 310 of the previously described embodiment, body 410 of embodiment 400 has a rectangular box-like configuration with a linear lengthwise extension along axis A. Upper portion 412 tapers to a narrow portion 416 and expands laterally to a rectangular top opening 414. The narrow portion 416 is configured and dimensioned so as to provide a cross sectional outlet area adapted to control the quantity and direction of the vapor flow therethrough. The body 410 is preferably fabricated from pBN, but also includes an integral patterned conductor 415 of pyrolytic or bulk graphite which extends along one or both of lengthwise sides 413a and/or 413b. Preferably, the conductor 415 is overcoated with a layer of pBN. Typically, body 410 will have a length L of from 100 mm to 600 mm to cover the width of a standard photovoltaic ("PV") panel, or up to 1,200 mm to cover the length of a standard PV panel, and a width W of from about 50 mm to about 100 mm or larger as necessary to contain sufficient volume of material for operational efficiency. In use, an electrical power source 420 is connected to terminal points 415a and 415b of the conductive line 415 by means of wires 421a and 421b, respectively. During operation, electrical power applied to conductive line 415 causes it to heat body 410 to a temperature sufficiently high to cause vaporization of at least part of the contents of the containment vessel 400. Heating can be accomplished by resistance heating or induction heating.

Figure 6:
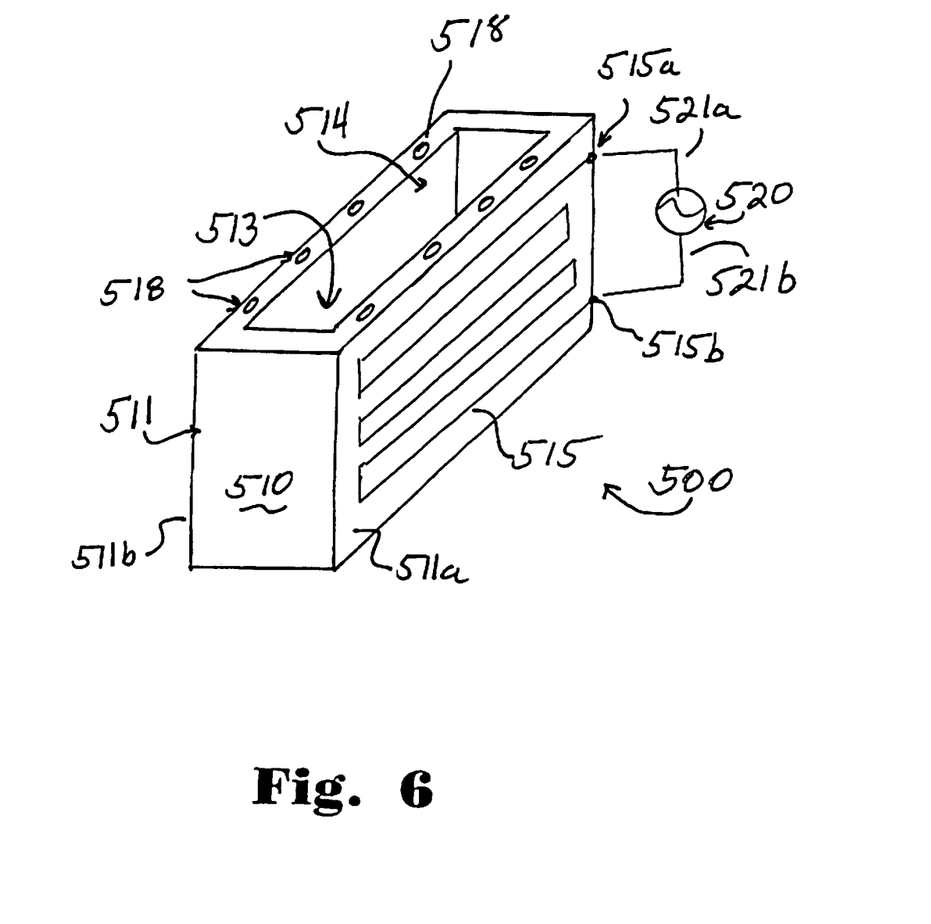
FIG. 6 illustrates yet another embodiment of the crucible of the invention.

In yet another embodiment, referring now to FIG. 6, containment vessel 500 includes a body 510 having a rectangular box-like structure defined by wall 511, which encloses an interior reservoir 513 for containing material to be vaporized. Opening 514 extends across the top of body 514. Optionally, the body 510 includes apertures 518 along the top surface of wall 511 to receive fasteners by which a plate such as that shown in FIG. 3 and described above can be attached to regulate the emission of vapor from containment vessel 500.

Body 510 is preferably fabricated with pBN, but includes an integral patterned conductor 515 of pyrolytic or bulk graphite, which extends along at least one or both of lengthwise sides 511a and 511b. Conductor 515 is preferably overcoated with a layer of pBN. The length and width dimensions of body 510 can be similar to those of body 410 describe above. In use, an electrical power source 520 is connected to terminal points 515a and 515b by means of wires 521a and 521b, respectively. During operation, as described above, electrical power is applied to conductive line 515 to heat body 510. Heating can be accomplished by resistance heating. Alternatively, induction heating can be employed.

Optionally, the embodiments 100 and 200 of the invention illustrated in FIGS. 1 and 2 can include the heating means (e.g. 315, 415 or 515) of embodiments 300, 400 or 500.

Figure 7:
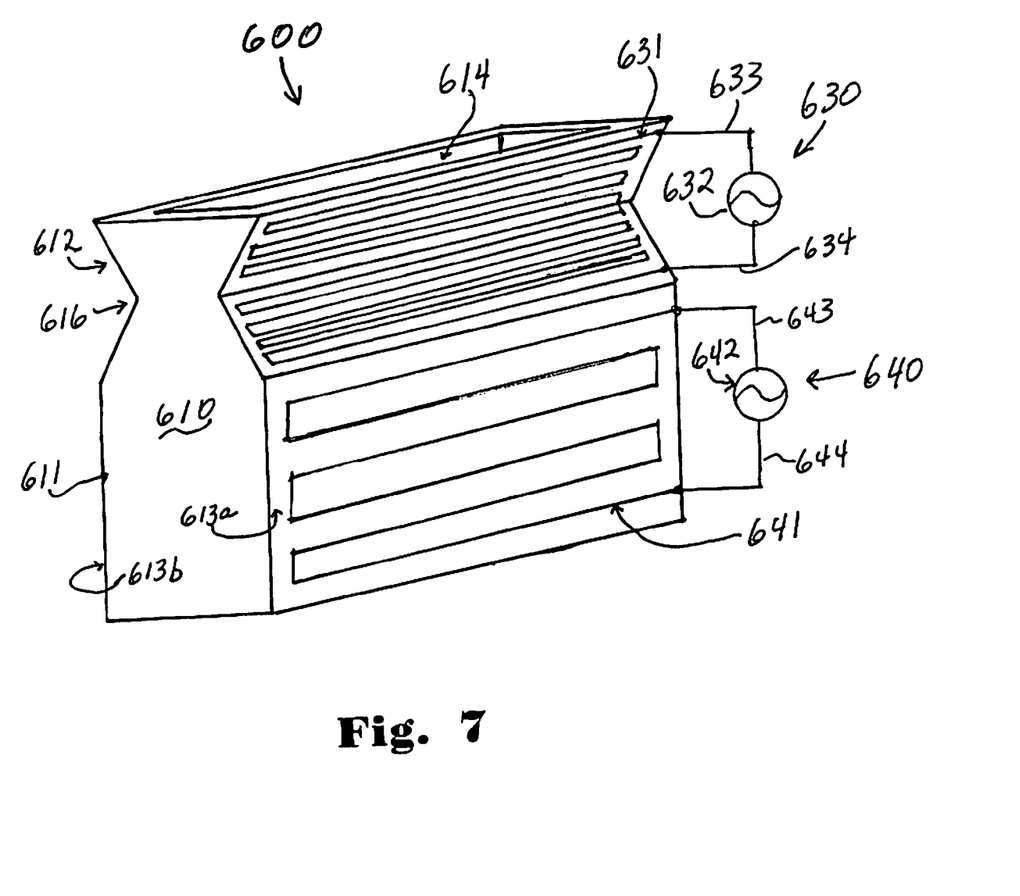
FIG. 7 illustrates an embodiment with an engineered power distribution system.

Referring now to FIG. 7, an embodiment 600 of the containment vessel is shown including a body 610 having a lower portion 611 with an interior reservoir adapted to contain material to be vaporized. Upper neck portion 612 tapers to a narrow portion 616 and expands laterally to a rectangular top opening 614. The narrow portion 616 is configured and dimensioned to provide a cross sectional outlet area adapted to control the quantity and direction of the vapor flow therethrough. The body 610 is preferably fabricated from a non-conductive refractory ceramic such as pBN, but includes an integral patterned electrode conductor 641 of pyrolytic or bulk graphite which extends along one or both of the lengthwise sides 613a and 613b. Preferably the conductor 641 is overcoated with a layer of pBN. In use a power supply system 640 including conductive leads 643 and 644, and a power source 642 is connected to the conductor 641 to heat the containment vessel 600 to a temperature sufficient to vaporize the material in the interior of the body 610.

Condensation of the material is a problem which often occurs in such coating processes as described herein. For example, some material evaporated from the lower portion 611 of the containment vessel can condense in the hour-glass shaped upper portion 612 and deposit at relatively cooler portions on the interior wall. This deposited material can obstruct the flow of vapor and cause non-uniformities of the coating process.

To alleviate this problem the present invention comprises an engineered power distribution system which includes a tailored electrode. That is, the integral patterned conductor incorporated into the wall of the containments vessel is positioned and configured to selectively distribute more or less power to the containment vessel to compensate for the differential temperatures and areas of condensation of the containment vessel. Thus, cold spots can be overcome by applying more power to the affected areas.

Referring to FIG. 7, a conductor 631, i.e., a tailored electrode, is incorporated into the surface of the body 610 at the upper portion 612. Conductive line 631 can be patterned, for example, by closer spacing or by other suitable configuration to apply heat differentially to cooler spots of the containment vessel 600 so as to provide more uniform heating. The conductor 631 can be connected to the same power supply 640 as conductor 641 or it can be separate from or integral with conductor 641. In another embodiment, conductor 631 can be connected to a separate power supply 630 which includes electrical lines 633 and 634, and a power source 632. Power levels can be adjusted to meet the needs of the local heating requirements to compensate for, and eliminate, cold spots at which unwanted condensation of the material can occur on the inner surface of the containment vessel 600.

Figure 8:
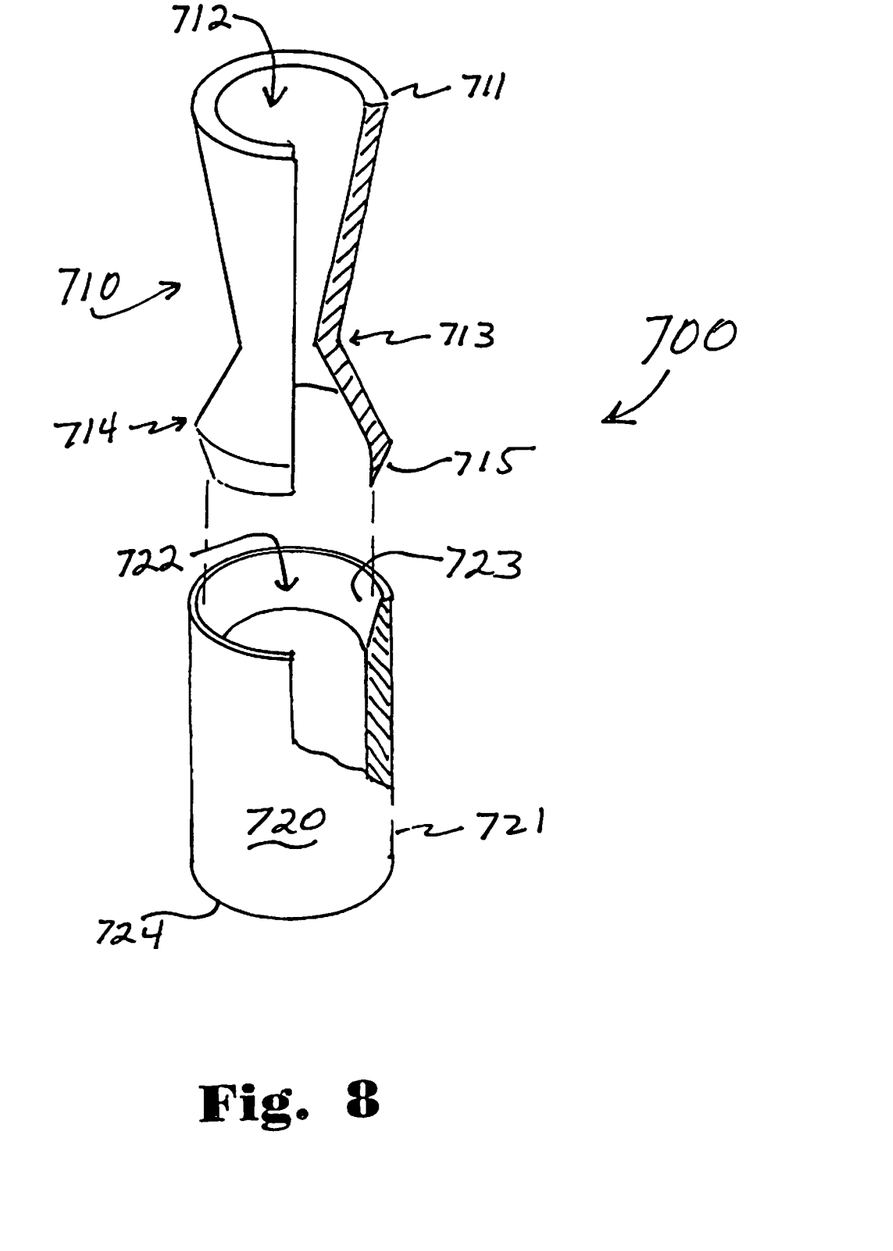
FIG. 8 is an exploded partly sectional view of another embodiment of the invention including a two part crucible.
Figure 9:
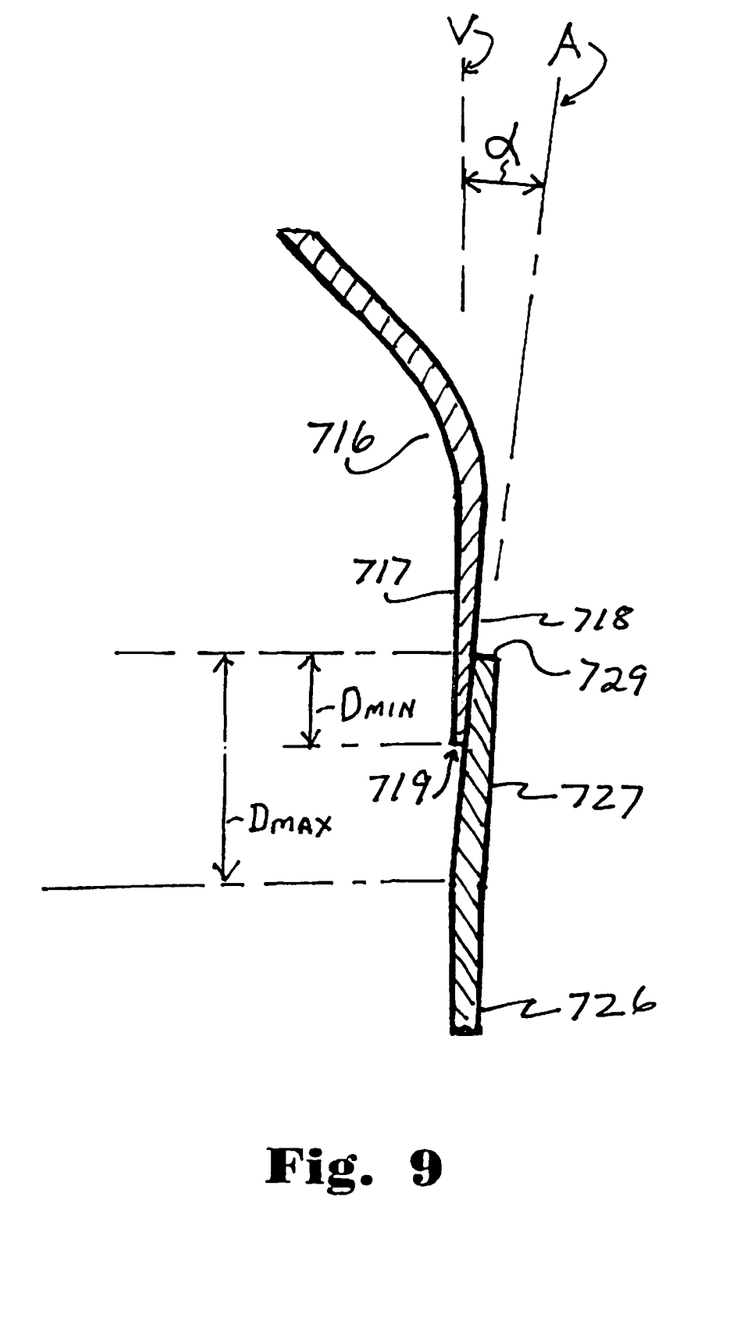
FIG. 9 is yet another embodiment of the two part crucible.

Referring now to FIGS. 8 and 9, a two part "Sumo-style" crucible is illustrated. As stated previously to make a single piece pBN crucible with a narrow orifice the pBN is typically deposited by, for example, chemical vapor deposition onto a graphite mandrel of the appropriate shape to form the body of the crucible. However, the graphite mandrel must then be oxidized to remove it as it cannot be mechanically withdrawn from the crucible. To alleviate this problem multi-part crucibles have been made, as disclosed for example, in U.S. Pub. No. 2007/0289526. The graphite mandrels can be physically separated from the respective crucible parts. These parts can then be assembled. Yet the method described in this reference nevertheless requires an additional step, i.e., overcoating the assembled crucible parts at least at the joint so as to provide an hermetic seal. As used herein the term "hermetic seal" means that there is no visual leak/failure in the joint of the parts of the crucible after the crucible is exposed to a molten metal for a continuous period of at least 8 hours. We have discovered a method to provide and assemble a two-piece crucible which obviates the need for an additional overcoating.

The individual pieces are fabricated on separate graphite mandrels by CVD deposition of pBN or other material from which the crucibles can be made. The graphite mandrels are then physically separated from the crucible body parts. A significant feature of the crucible herein is the tapered ends which engage each other and fit snugly so as to provide a tight seal and obviate the need for any subsequent overcoating. This represents considerable savings of time, labor and expense in the fabrication process.

Referring more particularly now to FIG. 8, two-piece crucible 700 includes an upper piece 710, and a lower piece 720 for containing the material to be vaporized. The upper piece 710 includes an hour-glass shaped body 711 defining a vapor flow path 712 having a narrow orifice portion 713 for controlling the vapor flow therethrough. The wide bottom part 714 of the upper piece terminates with a tapered annular portion 715.

The tapered outer facing surface of annular portion 715 is adapted to snugly engage a correspondingly tapered inner facing annular surface 723 at the upper portion of the lower piece 720. Lower piece 720 includes a generally cylindrical shaped body 721 having an open upper end 722 and a closed bottom end 724. The thickness of the body 721 in the vicinity of the upper end decreases to provide the tapered surface 723. However the outer diameter of the body 721 remains uniform throughout the length of the body. The upper piece 710 and lower piece are jointed by inserting the bottom part 714 of the upper piece into the open upper end 722 of the lower piece so as to mate the tapered surfaces 715 and 723 in a snug fitting engagement. The assembled crucible 700 can then be used in evaporative coating processes without requiring an overcoating to seal the joint area. Alternatively the angle of taper on the top and bottom sections can be reversed.

Referring now to FIG. 9, portion of an alternative embodiment of the two piece crucible is illustrated wherein the wall 716 of the upper piece terminates in an annular portion 717 with a tapered outer surface 718 provided by, for example, a reduction in the thickness of the wall 716.

The bottom piece 726 includes an annular upper outwardly flared portion 727 to receive the tapered portion 717 of the upper piece. The flared portion 727 is flared outwardly from vertical orientation V along an angled orientation A wherein angle α between V and A ranges from about 3 degrees to about 10 degrees and is typically such that the friction fitting of the pressed joint provides a stable structure.

The insertion depth between the upper edge 729 of the bottom piece 726 and the lower edge 719 of the wall 716 of the upper piece can range from a minimum insertion depth $D_{min}$ of from about 1 to 4 mm to a maximum insertion depth $D_{max}$ of from abut 9 mm to about 11 mm, to insure a snug fit between the upper and lower pieces to provide a mechanically robust tight seal without the need for overcoating the joint, and provide sufficient sealing between the two components to prevent excessive leakage of the source material. In an embodiment of the invention the insertion depth ranges from 3 mm ($D_{min}$) to 10 mm ($D_{max}$).

While the above description contains specifics, these specifics should not be construed as limitations of the invention, but merely as exemplifications of preferred embodiments thereof. Those skilled in the art will envision many other embodiments within the scope and spirit of the invention as defined by the claims appended hereto.

What is claimed is:

1. A containment vessel for evaporating materials for use in applying a coating to a substrate which comprises:
    a) at least one single piece monolithic body fabricated from a refractory material, said body including a reservoir for containing material to be evaporated, and having two opposite ends with means associated at said ends to permit mechanical joining of at least two of said bodies in an end to end fashion such that the reservoirs of each said bodies are joined to provide a continuous interior space, wherein the at least one body comprises a cylindrical wall and the reservoir is provided by an inner surface of the cylindrical wall defining an axial bore in the body, and the body includes a first end portion having an annular outer surface which tapers to a smaller outer diameter and a second end portion opposite the first end portion, the second end portion having an annular inner surface which flares outwardly to a larger inner diameter such that the first end portion of one cylindrical body is configured and dimensioned to be received into the second end portion of another cylindrical body.

2. The containment vessel of claim 1 further comprising:
    b) means to control emission of vapor from said containment vessel.

3. The containment vessel of claim 1 wherein the refractory material is selected from pyrolytic boron nitride and pyrolytic graphite coated with pyrolytic boron nitride.

4. The containment vessel of claim 1 comprising two or more bodies removably connected together in an end to end fashion.

5. A containment vessel for evaporating materials for use in applying a coating to a substrate which comprises:
    a) at least one single piece monolithic body fabricated from a refractory material, said body including a reservoir for containing material to be evaporated, and having two opposite ends with means associated at said ends to permit mechanical joining of at least two of said bodies in an end to end fashion such that the reservoirs of each said bodies are joined to provide a continuous interior space, wherein the at least one body comprises a cylindrical wall and the reservoir is provided by an inner surface of the cylindrical wall defining an axial bore in the body, and the means to control the emission of vapor from the containment vessel comprises a plurality of apertures in the cylindrical wall arranged in at least one row extending lengthwise along the body and configured and sized to control the passage of vapor therethrough.

6. A containment vessel for evaporating materials for use in applying a coating to a substrate which comprises:
    a) at least one single piece monolithic body fabricated from a refractory material, said body including a reservoir for containing material to be evaporated, and having two opposite ends with means associated at said ends to permit mechanical joining of at least two of said bodies in an end to end fashion such that the reservoirs of each said bodies are joined to provide a continuous interior space; and
    b) means to control emission of vapor from said containment vessel, wherein the body extends longitudinally and has a generally U-shaped lateral cross-section, wherein the reservoir is at least partially defined by an arcuate inner surface, and the vessel includes a first end portion having a first radially extending arcuate flange, a second end portion having a radially extending second arcuate flange, a first linear flange extending laterally from a first longitudinal edge of the body and a second linear flange extending laterally from a second longitudinal edge of the body.

7. The containment vessel of claim 6 wherein each of said first and second radially extending arcuate flanges includes at least one aperture, said apertures being aligned so as to receive a fastener for joining one containment vessel with another.

8. The containment vessel of claim 6 wherein the means to control the emission of vapor comprises a plate member removably connectable to the first and second linear flanges and having a plurality of apertures configured and sized to control the passage of vapor therethrough.

9. The containment vessel of claim 6 comprising two or more bodies removably connected in end-to-end fashion.

10. The containment vessel of claim 9 further comprising a gasket disposed between the arcuate flanges of adjacent bodies.

11. The containment vessel of claim 10 wherein the gasket is fabricated from graphite.

12. The containment vessel of claim 10 wherein first a longitudinally extending arcuate flange in the end portion of one body is mated with an arcuate recess in the second end portion of an adjacent body so as to overhang the gasket and inhibit contact between the gasket and material in the reservoir.

* * * * *